US012726182B2

(12) United States Patent
Väänänen et al.

(10) Patent No.: US 12,726,182 B2
(45) Date of Patent: Sep. 1, 2026

(54) NODE VOLTAGE CONTROL

(71) Applicant: Nordic Semiconductor ASA, Trondheim (NO)

(72) Inventors: Jarmo Väänänen, Oulu (FI); Jaakko Haapalahti, Oulu (FI); Lauri Linnansaari, Oulu (FI)

(73) Assignee: Nordic Semiconductor ASA, Trondheim (NO)

( * ) Notice: Subject to any disclaimer, the term of this patent is extended or adjusted under 35 U.S.C. 154(b) by 302 days.

(21) Appl. No.: 18/653,140

(22) Filed: May 2, 2024

(65) Prior Publication Data

US 2024/0388278 A1 Nov. 21, 2024

(30) Foreign Application Priority Data

May 17, 2023 (GB) ..................................... 2307347

(51) Int. Cl.
*H03K 3/012* (2006.01)
*H03K 5/01* (2006.01)

(52) U.S. Cl.
CPC ............... *H03K 3/012* (2013.01); *H03K 5/01* (2013.01)

(58) Field of Classification Search
CPC ...... H03K 19/0016; H03K 3/012; H03K 5/01; G06F 1/3203; G06F 1/3206
See application file for complete search history.

(56) References Cited

U.S. PATENT DOCUMENTS 9,690,361 B2 * 6/2017 Elibol ........................ G06F 9/54
10,074,321 B2 * 9/2018 de Greef .............. G09G 3/2011
2008/0191789 A1 8/2008 Anidjar et al.
2012/0204047 A1 8/2012 Ryoo

OTHER PUBLICATIONS

IPO Search Report under Section 17 for Great Britain Application No. 2307347.1, dated Nov. 27, 2023, 4 pages.

* cited by examiner

*Primary Examiner* — Diana J. Cheng
(74) *Attorney, Agent, or Firm* — Klarquist Sparkman, LLP

(57) ABSTRACT

A circuit portion has an analog voltage supply module, a clock and a digital control module clocked by the clock. A bias voltage is applied to an analog voltage supply module so that it supplies a voltage to a node. The voltage is sampled at the node, at a signal edge of the clock, to obtain a sampled voltage. The sampled voltage is stored, the bias voltage to the analog voltage supply module is disabled and the sampled voltage is supplied to the node. A refresh signal is subsequently generated in response to at least one refresh criterion being met; and in response to the digital control module receiving the refresh signal, a refresh sequence is initiated. The refresh sequence includes re-applying the bias voltage to the analog voltage supply module; re-sampling the voltage at the node at a signal edge of the clock; and storing the re-sampled voltage.

22 Claims, 4 Drawing Sheets

NODE VOLTAGE CONTROL

CROSS REFERENCE TO RELATED APPLICATION

This application claims priority from Great Britain Application No. 2307347.1, filed May 17, 2023, which application is incorporated herein by reference in its entirety.

TECHNICAL FIELD

This invention relates to a method and apparatus for reducing power consumption of analog circuitry, particularly in integrated circuit chips.

BACKGROUND

There are many ways to reduce power consumption in the digital domain of an integrated circuit. However, many of these design techniques are not suitable for the analog domain.

Mixed signal integrated circuits are integrated circuits containing both digital and analog circuitry. Such devices are typically battery powered and, in order to increase their operating lifetime, power savings are desirable.

It will be appreciated by the skilled person that analog circuitry and digital circuitry have very different power consumption characteristics with analog components generally using more power to meet linearity requirements. Thus, there is a need to reduce the power consumption of analog circuitry where possible. In semiconductor devices, current leakage arises from quantum effects within the transistors. Leakage increases power consumption and is an unavoidable factor that limits integrated circuit performance.

Ultra-low power consumption is an important goal for Internet of Things (IoT) products. Reducing power consumption provides battery-powered devices in particular with a longer battery life. It is desired to find new ways to further reduce power consumption of mixed signal circuitry without sacrificing performance. The present invention seeks to address this issue.

SUMMARY OF INVENTION

From a first aspect, the invention provides a method of controlling a circuit portion comprising an analog voltage supply module, a clock and a digital control module clocked by the clock; the method comprising:

- applying a bias voltage to an analog voltage supply module so that the analog voltage supply module supplies a voltage to a node;
- sampling the voltage, at the node at a signal edge of the clock, to obtain a sampled voltage;
- storing the sampled voltage;
- disabling the bias voltage to the analog voltage supply module;
- supplying the sampled voltage to the node;
- subsequently generating a refresh signal in response to at least one refresh criterion being met; and
- in response to the digital control module receiving the refresh signal, initiating a refresh sequence comprising:
  - re-applying the bias voltage to the analog voltage supply module;
  - re-sampling the voltage at the node at a signal edge of the clock; and
  - storing the re-sampled voltage.

From a second aspect, the invention provides a circuit portion comprising:

- an analog voltage supply module arranged to receive a bias voltage and arranged to supply a voltage to a node;
- a clock; and
- a digital control module clocked by the clock;
- wherein the circuit portion is arranged to:
  - sample the voltage at the node at a signal edge of the clock, to obtain a sampled voltage, and store the sampled voltage;
  - disable the bias voltage to the analog voltage supply module and supply the sampled voltage to the node; and
  - subsequently generate a refresh signal in response to at least one refresh criterion being met; and
- wherein the digital control module is arranged to:
  - receive the refresh signal; and
  - initiate a refresh sequence, in response to the digital control module receiving the refresh signal, comprising:
  - re-applying the bias voltage to the analog voltage supply module;
  - re-sampling the voltage at the node at a signal edge of the clock; and
  - storing the re-sampled voltage.

Thus, it will be seen that, in accordance with the invention, a stored node voltage can be 'refreshed', meaning that it can be restored to a previous higher value, when a refresh criterion is met. A refresh may be needed when the node voltage has decayed, e.g. through current leakage—a common problem in integrated circuits.

As the voltage refresh is digitally implemented and synchronised to the clock it may facilitate precise timing and allow for tunable delays of control signals for the analog circuitry (e.g. in this case the analog voltage supply module). By controlling the node voltage in this way the power consumption of the analog voltage supply module (e.g. and any further analog circuitry connected to the node) may be substantially decreased. This is effectively achieved by reducing the active time of the analog circuitry and thus decreasing the total current consumption. Embodiments of the invention may, therefore, help to maintain the node voltage by refreshing it, whilst supporting ultra-low power consumption.

Thus, the invention can provide a power saving control methodology for analog integrated circuitry capable of running signal processing for a short time which can be kept powered down for the majority of the running time. This dynamic ON/OFF control of integrated analog circuitry allows for the reduction of the average power consumption to an extremely low level.

The power savings provided by controlling the node voltage may be exploited for reducing power consumption by various analog circuitry components; e.g. amplifiers, comparators, bias generators, current generators or current mirrors; which can be disabled or turned off when they are not needed and activated when analog signal processing is required. The duty cycle for such analog signal processing is preferably low in order to gain the most benefit in power consumption.

In a set of embodiments, the step of disabling the bias voltage to the analog voltage supply module and subsequently generating a refresh signal are spaced apart in time, e.g. by several seconds.

The analog voltage supply module may comprise a detector, e.g. comprising a comparator, and an amplifier for providing a voltage to the node. The output of the amplifier may be connected to an input of the detector to allow the node voltage to be monitored. The detector may determine if the node voltage falls below a certain value.

In a set of embodiments, further analog circuitry is connected to the node and the voltage at the node provides a reference voltage or bias voltage for said further analog circuitry. For example, the further analog circuitry could comprise a DC-DC converter. The further analog circuitry may be operated while the analog voltage supply module is disabled.

There may be a number of ways to generate a refresh signal. For example, in a set of embodiments, the refresh signal is generated when the node voltage falls below a threshold or is perturbed, for example, by the circuit portion experiencing a change in load. Therefore, the refresh criterion may be that a voltage measured at the node is determined to fall below a threshold value. The voltage of the node may be measured by a detector which remains operational even when the analog voltage supply module is disabled.

The refresh criterion may be that the further analog circuitry described above, e.g. the DC-DC converter, outputs a refresh signal, e.g. a request for a voltage refresh based on an internal voltage measurement.

The refresh criterion may be such that a refresh signal is periodically generated, e.g. based on a timer. The timer may be clocked with a second clock. Such a clock may be different to the clock clocking the digital control module and preferably has a lower frequency compared to the clock used in the refresh sequence. For example, the frequency of such a clock may be at least 1000 times lower than the frequency of the clock clocking the digital control module. In this way the periodically generated refresh signal can act as an automatic backup to help to ensure that the node voltage is refreshed periodically. This may be helpful if, for example, the detector fails.

The refresh criterion may be that a system transition is scheduled or detected. For example, such a system transition could be when software controlled low dropout regulators are turned on or in the event of some other system transition, e.g. a change from one mode to another. These changes cause the node voltage to be perturbed and so applying the bias voltage to the analog voltage supply module prior to such a transition would beneficially enable the perturbations in the voltage to be minimised by allowing it to be refreshed during such transitions.

In a set of embodiments, the clock is a digital clock—e.g. the clock may be a CMOS clock. Synchronizing the refresh and sampling sequence to digital clock facilities a precise timing and delays of control signals for the analog circuitry. The clock may have a frequency above 1 MHZ, preferably about 4 MHz. Such a high frequency clock provides a fast startup time for the digital control module and helps to ensure that the voltage at the node is restored quickly.

The clock may be disabled when the digital control module is not being used. This may help to substantially decrease the power consumption of the circuit portion, especially if a clock having a high frequency, e.g. a frequency above 1 MHZ, is used. In a set of embodiments, in response to the digital control module receiving the refresh signal, the clock is enabled to clock the digital control module, e.g. so that the re-sampling of the voltage occurs at a signal edge of the clock, and the clock is disabled after the re-sampled voltage is stored. The clock may be enabled in response to a signal from the digital control module. The clock may be disabled when the signal is removed (e.g. goes to zero).

In a set of embodiments, the digital control module is disabled before the refresh signal is received by the digital control module and, in response to the digital control module receiving the refresh signal, the clock is enabled to clock the digital control module.

The circuit portion may comprise a leakage detector. In a set of embodiments, the analog voltage supply module comprises a leakage detector that compares a reference voltage to a node voltage received by the leakage detector In a set of such embodiments the leakage detector is arranged to store a copy of the node voltage to provide the reference voltage and to subject the reference voltage to a deliberate artificial leakage. The leakage detector may comprise a circuit arrangement configured to provide said artificial leakage. Advantageously the artificial leakage is higher than a maximum actual leakage experienced by any of the nodes served by the analog voltage supply module. The leakage detector may be arranged to compare the reference voltage to a present value of the voltage at the node. In a set of embodiments, when the difference between the reference voltage, i.e. the voltage that is subject to the artificial leakage, and the present value of the voltage exceeds a predetermined threshold difference, a refresh request signal is output by the leakage detector. This arrangement may be beneficial in ensuring that the voltage at the node is refreshed before the actual leakage it experiences causes it to drop below a threshold amount because it is based on an artificially higher leakage rate. Moreover as such an arrangement only requires a relative comparison rather than comparison with an absolute value, it can be implemented without requiring significant power consumption.

The complexity of integrated circuit design means that there may be tens of thousands of nodes involved. When so many nodes are involved, tracking them becomes a challenge. By monitoring a node with the highest leakage current, the refresh sequence restores the voltage of the most depleted node so that all the plurality of nodes can be maintained at a suitable voltage, even when the number of nodes is too high to monitor each node individually.

Thus, in a set of embodiments, the circuit portion may comprise a plurality of nodes having a plurality of respective node voltages. The node voltages may be set when the analog supply module and/or the further analog circuitry is biased and enabled. In such a set of embodiments, after the node voltages have reached a level suitable for steady state operation, the analog supply module and/or the further analog circuitry may be disabled and the node voltages are sampled and stored, e.g. until the next refresh signal is received. The deliberate artificial leakage mentioned above (e.g. on the reference voltage) is preferably greater than a leakage on any of the plurality of nodes. This helps to ensure the stored voltages of the plurality of nodes are maintained in acceptable limits with respect to a steady state operation voltage.

The sampled voltage and the re-sampled voltage may be stored in any suitable way. In a set of embodiments, a capacitance, e.g. a capacitor, stores the sampled voltage and/or the re-sampled voltage. It will be appreciated by the skilled person that the capacitance may drain over time, e.g. due to leakage or parasitic losses. The capacitance may be connected to further analog circuitry so as to supply the further analog circuitry with a voltage until the refresh sequence is initiated to charge up the capacitance again. It should be understood that the capacitance may be a discrete capacitive component, such as a capacitor (e.g. within the analog voltage supply module and/or within the further analog circuitry), or it may be parasitic capacitance of other parts of the circuit portion.

Embodiments of the invention therefore help to provide improved control of the voltage stored by the capacitance. As the node voltages suitable for steady state operation of analog circuitry may be maintained by the capacitance, in this way, analog circuitry (e.g. the analog supply module and/or further analog circuitry) can be enabled for a short period to complete the signal processing and turned off (i.e. disabled) again to save power. As will be appreciated by the skilled person, 'enabling' a part of the circuit requires some power, e.g. a bias voltage, to be applied.

In a set of embodiments, the refresh sequence comprises a plurality of phases wherein at least one of the phases has a programmable minimum duration. For example, the refresh sequence may comprise: a first, settled, phase; a second, refresh, phase; and a third, sample, phase. The refresh and sample phase may have programmable minimum durations. The digital control module may comprise a timing module which allows the minimum duration of each phase to be tuned, e.g. via one or more programmable registers. The settled phase may follow a ready signal from the analog voltage supply module and allow for a short settling time (e.g. one clock cycle) before entering the refresh phase which may be maintained for a predetermined (e.g. programmable) minimum period before the sample phase begins. The delay helps to allow the sampled voltage to be reliable and robust. The ability to tune the timing of these phases allows unnecessary delays to minimised and allows precise programming of the active time of the analog circuitry to, in turn, minimise the time spent consuming current.

The digital control module may comprise a finite state machine and combinatory logic configured to control enabling of the analog circuitry, sampling voltages and disabling the analog circuitry.

In a set of embodiments the digital control module comprises a chain of flip-flops for capturing short signals asynchronously. The chain of flip-flops may capture a short refresh request and extend it, e.g. by at least a few clock cycles, to compensate for the time gap between the asynchronous request and the synchronous request to enable the analog voltage supply module and/or the clock. This helps to allow these components to be quickly started up asynchronously while not being inadvertently disabled before synchronous operation takes over.

In a set of embodiments, the sample phase has a first duration and a programmable second duration. In other words, an optional extension period maintains the sampling phase for back-to-back refresh signals received by the digital control module. The optional extension period may be implemented with a counter. The extension period may be programmable.

The circuit portion may be a circuit portion of an integrated circuit chip. The chip may be integrated on a single semiconductor wafer—e.g. a silicon wafer. It may be a system-on-chip (SoC). It may comprise a radio peripheral. The chip may be a radio-on-a-chip device.

Features of any aspect or embodiment described herein may, wherever appropriate, be applied to any other aspect or embodiment described herein. Where reference is made to different embodiments or sets of embodiments, it should be understood that these are not necessarily distinct but may overlap.

BRIEF DESCRIPTION OF THE DRAWINGS

One or more non-limiting embodiments will now be described, by way of example only, with reference to the accompanying drawings, in which.

DETAILED DESCRIPTION

Mixed signal integrated circuit devices, having both digital and analog circuitry, are commonly used in ultra-low power devices for Internet of Things (IoT) applications. Such devices are typically battery powered and, in order to increase their operating lifetime, power savings are desirable. The embodiment described below provides a solution to achieve ultra-low power consumption for a circuit comprising both digital and analog circuitry.

Figure 1:
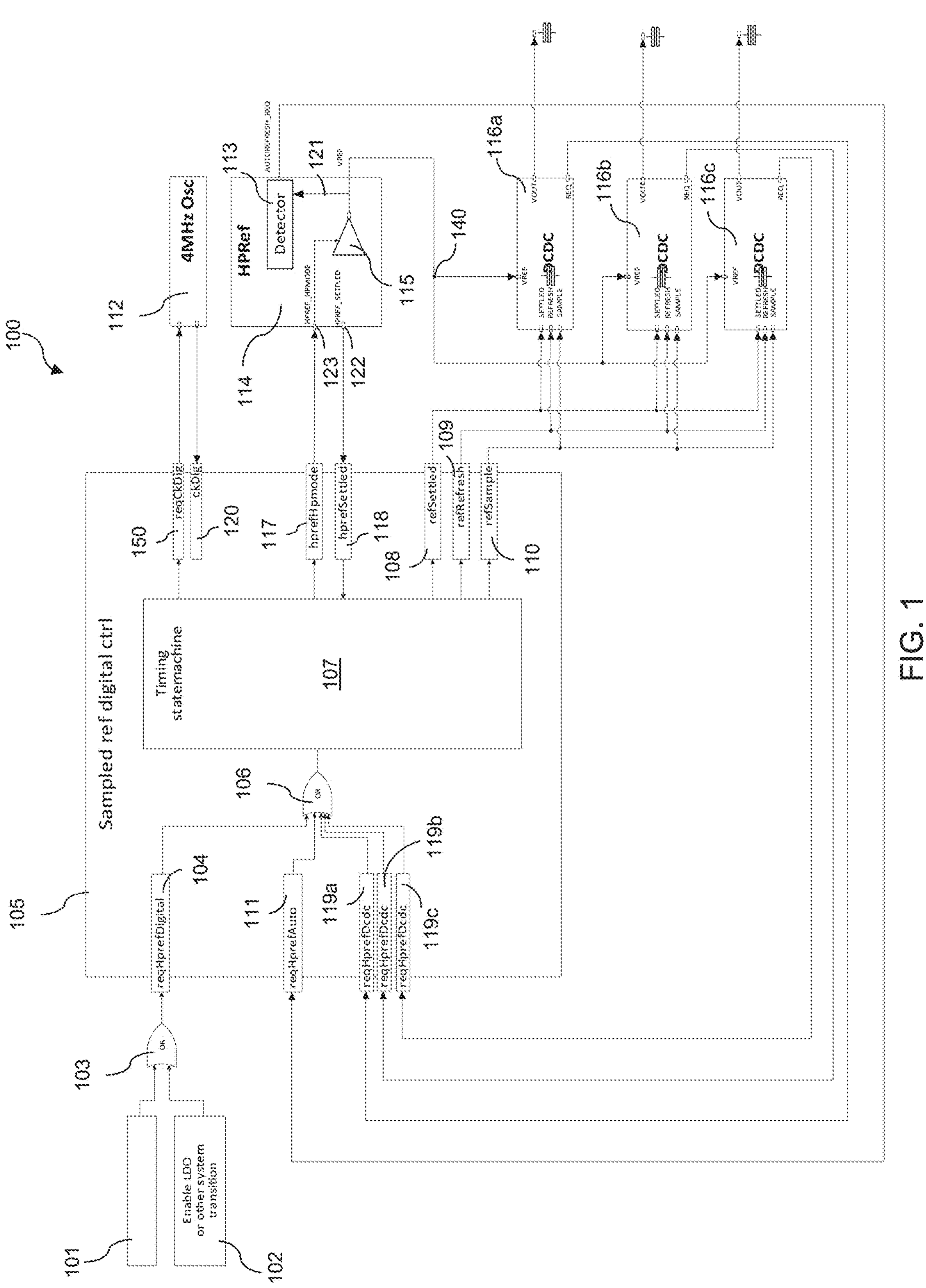
FIG. 1 is a block diagram of a circuit portion embodying the invention.
Figure 2:
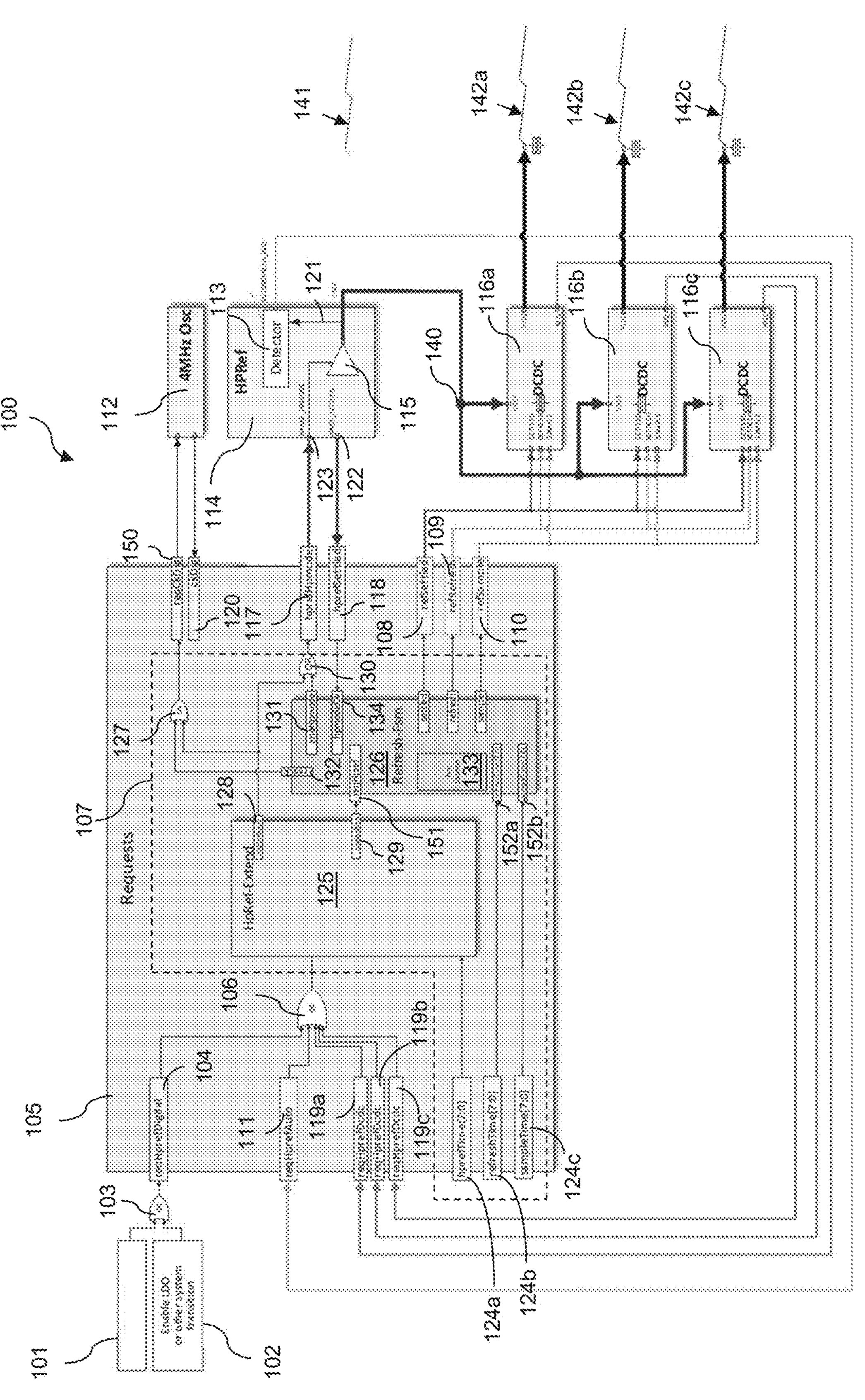
FIG. 2 is a logic diagram showing the circuit portion of FIG. 1 in more detail.

FIG. 1 shows a circuit portion 100 of an integrated circuit chip according to an embodiment of the invention. In broad overview, the circuit portion 100 stores a voltage at a node 140 which is restored between powered-down periods by a refresh sequence initiated by a refresh request signal. The circuit portion is controlled, in this way, to maintain the node voltage while reducing overall power consumption by removing the need for a constant power supply to the current consuming analog circuitry. Analog circuitry consumes a lot of power, therefore, powering down the analog circuitry for as much time as possible helps to achieve ultra-low power consumption. Thus, the circuit portion 100 of FIGS. 1 and 2 is particularly suitable in a battery-powered integrated circuit device.

The circuit portion 100 includes a digital control module 105 and an analog voltage supply module 114. The analog voltage supply module 114 is connected to the reference voltage input of multiple analog DC-DC converters 116*a-c*, i.e. further analog circuitry, via a node 140. The analog voltage supply module 114 and DC-DC converters 116*a-c* are both controlled, at least in part, by the digital control module 105.

The circuit portion includes a 4 MHz clock 112 for clocking the digital control module 105 and an optional timer 101 clocked by a 1 kHz clock (not shown).

The digital control module has inputs 104, 111, 119*a-c* for receiving 'request' signals which are connected to the inputs of an OR gate 106. The OR gate 106 is connected to a timing module 107 which interfaces with the 4 MHz clock 112, the analog voltage supply module 114 and the DC-DC converters 116*a-c*.

The interface between the timing module 107 and the 4 MHz clock 112 allows the clock 112 to be enabled by the digital control module 105, via a clock enabling output 150, and a clock signal to be received by the digital control module 105 via a clock signal input 120.

Similarly, the interface between the timing module 107 and analog voltage supply module 114 allows the analog voltage supply module 114 to be enabled, i.e. turned on, for the refresh sequence to be executed. The analog voltage supply module 114 has an input 123 for receiving an enabling input from the digital control module 105 and an output 122 for responding to the digital control module 105 with a 'ready' signal.

The analog voltage supply module 114 has a leakage detector 113, e.g. comprising a comparator, and an amplifier 115 for providing a reference voltage ($V_{REF}$) to the node 140. The output of the amplifier 115 ($V_{REF}$) is connected to an input of the detector 113 via a connection 121.

The digital control module 105 interfaces with the analog voltage supply module 114 via a high power mode output 117 for enabling the amplifier 115 of the analog voltage supply module 114 and an input 118 for receiving an indication that the analog voltage supply module 114 has settled.

Each DC-DC converter 116*a-c* has two outputs—an output voltage ($V_{OUT}$) output and a request (REQ) output for allowing the DC-DC converter 116*a-c* to request that the digital control module 105 initiates a refresh sequence. The respective REQ outputs are connected to the OR gate 106 via corresponding 'request' signal inputs 119*a-c* of the digital control module 105. The leakage detector 113 of the analog voltage supply module 114 has an output connected to another 'request' signal input 111 of the digital control module 105. Another 'request' signal input 104 is connected to an output of an OR gate 103 which is itself connected to the optional timer 101 and a further functional block 102 that can trigger a request signal.

The digital control module has three outputs 108, 109,110 for triggering the three phases of a refresh sequence which are connected to corresponding inputs of each DC-DC converter 116*a-c*. A 'refSettled' output 108 is connected to the 'settled' input of each DC-DC converter 116*a-c*, the 'refRefresh' output 109 is connected to the 'refresh' input of each DC-DC converter 116*a-c* and the 'refSample' output 110 is connected to the 'sample' input of each DC-DC converter 116*a-c*.

FIG. 2 shows the circuit portion of FIG. 1 in more detail, particularly the timing module 107. Plots 141, 142*a-c* of the voltage over time for $V_{REF}$ and the DC-DC converter outputs are also provided in FIG. 2.

The timing module 107 of FIG. 2 includes a digital finite state machine (FSM) 126 preceded by an extension sub-module (labelled 'HpRef-Extend') 125 for allowing asynchronous or synchronous enabling of the clock and analog voltage supply module 114. This extension sub-module 125 is shown in more detail in FIG. 3. It comprises a delay chain of asynchronous D-type flip flops 301 which do not require a clock signal to change their output.

It also comprises a counter which includes a reset counter 303, a clock input 308 and a counterNotEnd output 304. This output 304 remains high while the counter 302 is running.

As well as having a counter input 306 connected to the programmable input 124*a* the extension sub-module 125 receives the output of the OR gate 106.

The extension sub-module 125 has an asynchronous output 128 for rapidly enabling the clock 112 and the analog voltage supply module 114. The extension sub-module 125 has a synchronous output 129 for keeping the clock 112 and the analog voltage supply module 114 enabled via the FSM 126 when the asynchronous request goes low.

The FSM 126 has a refresh request input 151 connected to the synchronous output 129 of the extension sub-module 125. The FSM 126 also has two programmable inputs 152*a,b*. One input 152*a* is for programming the duration of the refresh phase (via a programmable refresh duration input 124*b*) and another input 152*b* is for programming the duration of the sampling phase (via a programmable sample phase duration input 124*c*). The FSM 126 also includes a counter 133 for timing the output signals.

The FSM has a clock request output 132 for keeping the 4 MHz clock 112 enabled, a high power mode output 131 for keeping the analog voltage supply module 114 enabled and an input 134 for receiving a 'ready' response from the analog voltage supply module 114. As previously described, three outputs 108, 109, 110 are provided from the FSM 126 for the three phases of the refresh sequence—i.e. there is a 'settled' output 108, a 'refresh' output 109 and 'sample' output 110.

There are two OR gates 127, 130 within the timing module 107. One OR gate 127 has two inputs—the asynchronous output 128 of the extension sub-module 125 and the clock request output 132 of the FSM 126 respectively. The other OR gate 130 also has two inputs—the asynchronous output 128 of the extension sub-module 125 and the high power mode output 131 of the FSM 126 respectively.

The operation of the circuit portion 100 shown in FIGS. 1, 2 and 3 will be described in more detail below with further reference to FIG. 4.

The analog DC-DC converters 116*a-c* of the circuit portion are controlled by the reference voltage ($V_{REF}$) supplied by the node 140 which is supplied by the analog voltage supply module 114.

The analog voltage supply module 114 receives a bias voltage to power the analog amplifier 115 and the leakage detector 113 when enabled by the digital control module 105. While the analog voltage supply module 114 is powered up, the 4 MHz clock 112 is also enabled and clocks the digital control module 105. The circuit portion 100 samples the voltage at the node 140 at a signal edge of the clock 112, to obtain a sampled voltage which is stored, in a capacitance (not shown) present in each DC-DC converter 116*a-c*, e.g. capacitors. By storing the voltage in the capacitance, the sampled voltage at the node 140 can be maintained when the analog voltage supply module 114 is powered down.

Once the sampled voltage is stored in this way, the bias voltage to the analog voltage supply module 114 and the 4 MHz clock 112 can thus be disabled and the sampled voltage to the node can continue to be supplied to the remaining portions of the DC-DC converters 116*a-c*.

Although the analog voltage supply module 114 is powered down, the leakage detector 113, which has lower power requirements than the amplifier 115, remains operational.

The stored voltage ($V_{REF}$) will inevitably drain over time due to leakage and other current drawing effects, e.g. if a load is connected, as shown by the graph 141 of $V_{REF}$ over time, and will therefore need to be 'refreshed', i.e. restored, occasionally. The digital control module 105 responds to requests to refresh the voltage by initiating a refresh sequence and may receive a refresh (request) signal from a number of inputs 104, 111, 119*a-c* which are triggered by respective refresh criteria being met.

The first input 104 to the first OR gate 106 of the digital control module 105 goes high periodically according to the timer 101 or following a signal from the functional block 102. The functional block 102 may trigger a refresh signal, e.g. if software controlled low dropout regulators (LDOs) (not shown) were turned on or in the event of some other system transition, e.g. a change from one mode to another. Either of these changes would cause the stored voltage ($V_{REF}$) to be perturbed, and thus, a refreshed voltage would be required to ensure that the stored voltage is robust, e.g. to provide robust reference voltages. The OR gate 103 allows either the signal from the timer 101 or the functional block 102 to result in a refresh signal, i.e. the output of the OR gate 103 is high if either of the two inputs to the OR gate 103 is high. Thus, a refresh signal is received by the digital control module 105 when the signal at the uppermost input 104 goes high.

The second input 111 to the first OR gate 106 of the digital control module 105 goes high in response to a request signal from the leakage detector 113. The leakage detector 113 stores a copy of the voltage at the node 140 with added artificial leakage higher than the maximum leakage path of any of the nodes served by the analog voltage supply module 114 to generate a reference voltage and compares this reference voltage, subject to artificial leakage when the module is not powered, to the present value of the voltage at the node 140. When the difference between this reference voltage and the present voltage exceeds a predetermined threshold difference, a refresh request signal is output by the leakage detector 113.

The third, fourth and fifth inputs 119*a-c* to the first OR gate 106 of the digital control module 105 are respectively connected to the first, second and third DC-DC converters 116*a-c*. These inputs 119*a-c*, therefore, go high in response to a request signal from the corresponding DC-DC converter 116*a-c*. Each DC-DC converter 116*a-c* may independently determine when the $V_{REF}$ it receives needs to be restored, for example, by determining that the output voltage has fallen below a threshold value as demonstrated in the waveform of $V_{OUT}$ 142*a-c*.

As will be appreciated by the skilled person, if any of the refresh signal inputs 104, 111, 119*a-c* are high, the OR gate 106 output is high. Accordingly, if any one of the refresh criteria associated with the refresh signal inputs 104, 111, 119*a-c* are met, then a refresh sequence will be initiated by the digital control module 105.

In response to any of the above-mentioned refresh criteria being met, the OR gate 106 output goes high causing the timing module 107 to enable the 4 MHz clock 112 via the clock request output 150 and to enable the analog voltage supply module 114 via the high power mode output 117, i.e. which involves re-applying the bias voltage to the analog voltage supply module 114 to power the amplifier 115. The 4 MHz clock signal is received by the clock signal input 120. When start-up of the analog voltage supply module 114 is complete, a ready signal is received by the input 118 of the digital control module 105 from the output 122 of the analog voltage control module 114. The clock 112 and analog voltage control module 114 remain enabled for as long as the enabling signals from the clock request output 150 and high power mode output 117 remain high.

When the timing module receives the ready signal from the analog voltage control module 114, the settled phase, refresh phase and sampling phase are triggered one-by-one according to programmable or hard-coded timing parameters stored in the timing module 107. In this way, the circuit portion 100 re-samples the voltage at the node 140 at a signal edge of the clock 112, when power is being supplied to the analog voltage supply module 114. This re-sampled voltage is stored in the same way as the previously sampled voltage. The re-sampled voltage is higher than the voltage at the node 140 before the refresh sequence, i.e. it is restored. This allows the analog voltage supply module 114 and the 4 MHz clock to be disabled again with the steady state operation voltage maintained at the node 140.

Figure 3:
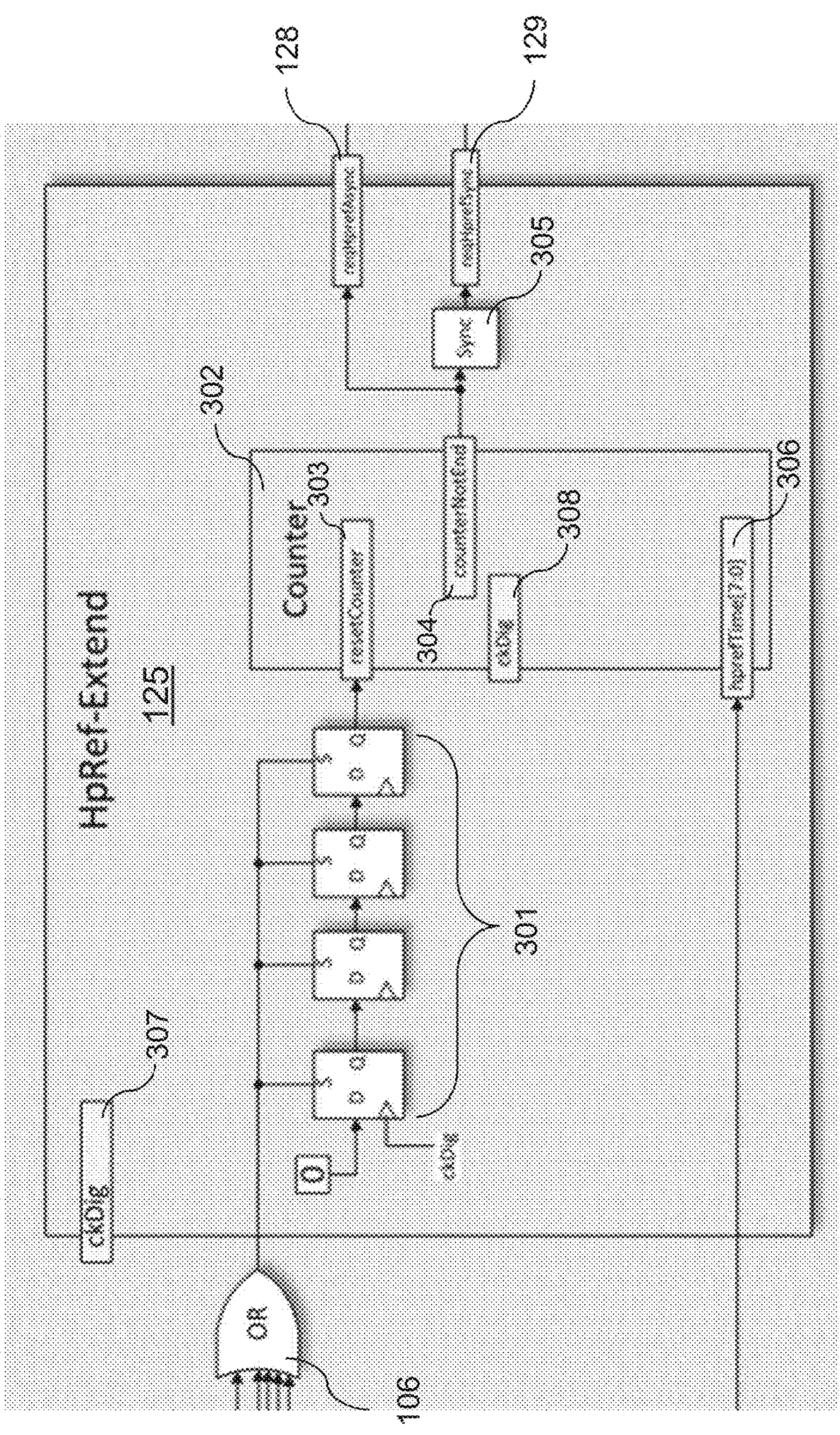
FIG. 3 is a more detailed schematic diagram of a part of the circuit portion of FIG. 2.

As can be seen in more detail in FIGS. 2 and 3, the timing module 107 has the extension sub-module (labelled 'HpRef-Extend') 125 for adding an optional extension feature and allowing asynchronous enabling of the clock and analog voltage supply module 114. The extension sub-module 125 is configured to capture a short pulse and extend it using the delay chain of asynchronous flip flops 301. As the OR gate 106 may generate very short pulses, the delay chain 301 takes care of the time gap between the asynchronous request being made and the finite state machine 126 sending synchronous requests to the clock 112 and the analog voltage supply module 114. This helps to ensure that these components 112, 114 can be quickly started up asynchronously while not being inadvertently disabled before the FSM 126 takes over with synchronous operation. Effectively, the delay chain 301 helps ensure that the asynchronous request signal and the synchronous request signal overlap.

A further optional delay may be provided by the extension sub-module 125 using the counter 302 which can have an additional delay provided to the counter input 306. After the refresh (request) signal from the delay chain 301 goes low a timer within the extension sub-module 125 goes low after a further, optional, programmed delay. The delay can be provided from a programmable input 124*a* to the extension sub-module 125. The delay adds an optional extension period to allow the sampling phase to be maintained during back-to-back refresh requests. This may be useful when there are many nodes served by the system, i.e. many DC-DC converters 116*a-c* issuing requests.

As well as the programmable input 124*a* the extension sub-module 125 receives the output of the OR gate 106. The extension sub-module 125 has a synchronous output 129 for enabling the clock 112 and the analog voltage supply module 114 via the FSM 126. The extension sub-module 125 also has an asynchronous output 128 for rapidly enabling the clock 112 and the analog voltage supply module 114 by bypassing the FSM 126.

Figure 4:
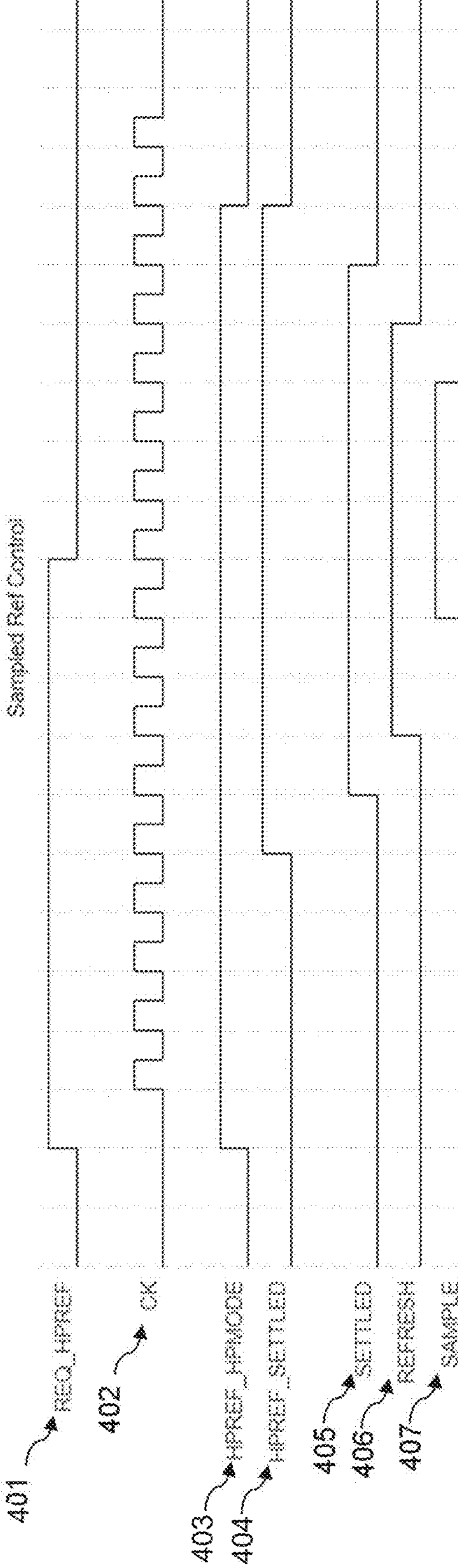
FIG. 4 is a timing diagram showing the signals involved in a refresh sequence according to methods embodying the present invention.

FIG. 4 is a timing diagram showing how a refresh sequence is performed. The rows 401-407 of the timing diagram illustrate the various signals present in the circuit portion of FIGS. 1, 2 and 3.

The first row 401 represents a request signal input to the digital control module 105 (REQ_HPREF); the second row 402 represents the clock signal of the 4 MHz clock 112 (CK); the third row 403 represents an enabling signal (i.e. the high power mode signal) from the digital control module 105 to the analog voltage supply module 114 (HPREF_HPMODE); the fourth row 404 represents an answer from the analog voltage supply module 114 to the digital control module 105 (HPREF_SETTLED); the fifth row 405 represents the 'settled' output from the digital control module 105 (SETTLED); the sixth row 406 represents the 'refresh' output from the digital control module 105 (REFRESH); and the seventh row 407 represents the 'sample' output from the digital control module 105 (SETTLED).

As can be seen in the first row 401, a request signal is sent to the digital control module 105 for a refresh sequence to begin. In this case, a DC-DC converter 116*a* has issued a request to refresh (i.e. restore) its reference voltage ($V_{REF}$). This refresh request signal enables the clock 112, as shown on the second row 402, and turns on the analog voltage supply module 114 with an enabling signal as shown on the third row 403. As can be seen in the fourth row 404, the analog voltage supply module 114 responds to the digital control module 105 indicating that the analog voltage supply module 114 is enabled and ready to be used. The time between the rising signal edge on the third row and the fourth row is, therefore, the start-up time of the analog voltage supply module 114.

Subsequently, the three phases of the refresh sequence are triggered in sequence by the digital control module 105 synchronously with the clock 112—on a rising clock edge, one clock cycle after the 'ready' response from the analog voltage supply module 114, the settled signal on the fifth row 405 goes high; on the next rising clock edge the refresh signal on the sixth row 406 goes high; and on a rising clock edge two clock cycles later, the sample signal on the seventh row 407 goes high and remains high for the programmed sample phase duration (i.e. 4 clock cycles) before falling. The falling edge of the sample signal is followed by the falling edge of the refresh signal on the sixth row 406 after a clock cycle, which in turn, is followed by the falling edge of the settled signal on the fifth row 405 after another clock cycle. On the next rising edge of the clock both signals on the third and fourth rows 403, 404 go low when the analog voltage supply module 114 is disabled and powered down.

It will be appreciated by those skilled in the art that the invention has been illustrated by describing one or more specific embodiments thereof, but is not limited to these embodiments; many variations and modifications are possible, within the scope of the accompanying claims.

The invention claimed is:

1. A method of controlling a circuit portion comprising an analog voltage supply module, a clock and a digital control module clocked by the clock; the method comprising:

applying a bias voltage to an analog voltage supply module so that the analog voltage supply module supplies a voltage to a node;

sampling the voltage, at the node at a signal edge of the clock, to obtain a sampled voltage;

storing the sampled voltage;

disabling the bias voltage to the analog voltage supply module;

supplying the sampled voltage to the node;

subsequently generating a refresh signal in response to at least one refresh criterion being met; and in response to the digital control module receiving the refresh signal, initiating a refresh sequence comprising:

re-applying the bias voltage to the analog voltage supply module;

re-sampling the voltage at the node at a signal edge of the clock to obtain a re-sampled voltage; and storing the re-sampled voltage.

2. The method of claim 1, wherein the refresh criterion corresponds to at least one of the following options (i) to (iv):

(i) that a system transition is scheduled or detected;

(ii) a refresh signal generated periodically;

(iii) the voltage measured at the node is determined to fall below a threshold value; or (iv) further analog circuitry connected to the node outputting a request for a voltage refresh based on an internal voltage measurement.

3. The method of claim 1, comprising:

in response to the digital control module receiving the refresh signal, enabling the clock to clock the digital control module; and after the re-sampled voltage is stored, disabling the clock.

4. The method of claim 1, comprising using a leakage detector to compare a reference voltage to a node voltage.

5. The method of claim 4, comprising storing a copy of the node voltage to provide the reference voltage and subjecting the reference voltage to a deliberate artificial leakage.

6. The method of claim 4, comprising generating a refresh request signal when the difference between the reference voltage and the voltage at the node is determined by the leakage detector to exceed a predetermined threshold difference.

7. The method of claim 4, comprising operating the leakage detector when the analog voltage supply module is disabled.

8. The method of claim 1, comprising a capacitance storing the sampled voltage and/or the re-sampled voltage.

9. The method of claim 1, wherein the refresh sequence comprises a plurality of phases including: a first, settled, phase; a second, refresh, phase; and a third, sample, phase and the method comprises programming respective minimum durations of the refresh phase and the sample phase.

10. The method of claim 9, wherein the sample phase has a first duration and a programmable second duration.

11. The method of claim 1, comprising capturing refresh request signals asynchronously using a chain of flip-flops.

12. A circuit portion comprising:

an analog voltage supply module arranged to receive a bias voltage and arranged to supply a voltage to a node;

a clock; and a digital control module clocked by the clock;

wherein the circuit portion is arranged to:

sample the voltage at the node at a signal edge of the clock, to obtain a sampled voltage, and store the sampled voltage;

disable the bias voltage to the analog voltage supply module and supply the sampled voltage to the node; and subsequently generate a refresh signal in response to at least one refresh criterion being met; and wherein the digital control module is arranged to:

receive the refresh signal; and initiate a refresh sequence, in response to the digital control module receiving the refresh signal, comprising:

re-applying the bias voltage to the analog voltage supply module;

re-sampling the voltage at the node at a signal edge of the clock to obtain a re-sampled voltage; and storing the re-sampled voltage.

13. The circuit portion of claim 12, wherein the refresh criterion corresponds to at least one of the following options (i) to (iv):

(i) that a system transition is scheduled or detected;

(ii) a refresh signal generated periodically;

(iii) the voltage measured at the node is determined to fall below a threshold value; or (iv) further analog circuitry connected to the node outputting a request for a voltage refresh based on an internal voltage measurement.

14. The circuit portion of claim 12, wherein the clock has a frequency above 1 MHz.

15. The circuit portion of claim 12, comprising a leakage detector arranged to compare a reference voltage to a node voltage received by the leakage detector.

16. The circuit portion of claim 15, wherein the leakage detector is arranged to store a copy of the node voltage to provide the reference voltage and to subject the reference voltage to a deliberate artificial leakage.

17. The circuit portion of claim 15, comprising a plurality of nodes having a plurality of respective node voltages, and wherein the deliberate artificial leakage is greater than a leakage on any of the plurality of nodes.

18. The circuit portion of claim 16, wherein the leakage detector is arranged to output a refresh request signal when the difference between the reference voltage and a present value of the voltage exceeds a predetermined threshold difference.

19. The circuit portion of claim 12, comprising a capacitance arranged to store the sampled voltage and/or the re-sampled voltage.

20. The circuit portion of claim 12, wherein the refresh sequence comprises a plurality of phases including: a first, settled, phase; a second, refresh, phase; and a third, sample, phase and wherein respective minimum durations of the refresh phase and the sample phase are programmable via programmable inputs to the digital control module.

21. The circuit portion of claim 20, wherein the sample phase has a first duration and a programmable second duration.

22. The circuit portion of claim 12, wherein the digital control module comprises a chain of flip-flops for capturing refresh request signals asynchronously.

* * * * *